(12) United States Patent
Pappu et al.

(10) Patent No.: US 12,127,364 B1
(45) Date of Patent: Oct. 22, 2024

(54) PLUGGABLE CARD FOR INTERSYSTEM CONNECTIVITY

(71) Applicant: Amazon Technologies, Inc., Seattle, WA (US)

(72) Inventors: Venkat Prashant Pappu, Round Rock, TX (US); Kenny Kiet Huynh, Lynnwood, WA (US)

(73) Assignee: Amazon Technologies, Inc., Seattle, WA (US)

( * ) Notice: Subject to any disclaimer, the term of this patent is extended or adjusted under 35 U.S.C. 154(b) by 285 days.

(21) Appl. No.: 17/686,865

(22) Filed: Mar. 4, 2022

(51) Int. Cl.
*H05K 7/14* (2006.01)
*H05K 5/02* (2006.01)

(52) U.S. Cl.
CPC ......... *H05K 7/1489* (2013.01); *H05K 5/0221* (2013.01); *H05K 5/0286* (2013.01); *H05K 7/1424* (2013.01); *H05K 7/1487* (2013.01)

(58) Field of Classification Search
None
See application file for complete search history.

(56) References Cited

U.S. PATENT DOCUMENTS

| 4,582,375 | A | * | 4/1986 | Keller | H05K 7/1452 361/801 |
| 9,723,756 | B1 | * | 8/2017 | Masters | H05K 7/1489 |
| 2006/0181398 | A1 | * | 8/2006 | Martich | H04L 12/66 340/310.17 |
| 2019/0045652 | A1 | * | 2/2019 | Hirano | H05K 7/1492 |
| 2020/0178413 | A1 | * | 6/2020 | Thibaut | H05K 7/1452 |
| 2022/0087045 | A1 | * | 3/2022 | Jorge | H05K 7/1445 |

* cited by examiner

*Primary Examiner* — James Wu
*Assistant Examiner* — Christopher L Augustin
(74) *Attorney, Agent, or Firm* — Kilpatrick Townsend & Stockton LLP

(57) ABSTRACT

A rack within a datacenter or other environment can include a plurality of appliances arranged in the rack such that ports of the appliances are aligned vertically or in another direction. A cartridge can include an elongate rigid body along which connectors are arranged. The connectors may be engageable with the aligned ports of the appliances in response to translation of the cartridge toward the rack. The cartridge can include an electronics board within the elongate rigid body, and the electronics board can provide paths among subsets of the connectors, for example, such that subsets of the appliances are accordingly connected for transmission of data or other signals.

18 Claims, 5 Drawing Sheets

PLUGGABLE CARD FOR INTERSYSTEM CONNECTIVITY

BACKGROUND

Datacenters house collections of servers and networking hardware, including switches and routers. Many different cabled connections between components may be used to, for example, permit data or power transfer between the components. The manner in which cables are managed can become a significant factor in datacenter operations, especially as any excess cabling can have corresponding costs to supply, install, and/or maintain. In addition, cables and/or accompanying structures to guide, retain, route, or otherwise manage cables can occupy significant amounts of space and thus reduce total space that can be available for components that contribute computing power within a datacenter.

BRIEF DESCRIPTION OF THE DRAWINGS

Various embodiments in accordance with the present disclosure will be described with reference to the drawings, in which.

DETAILED DESCRIPTION

Figure 1:
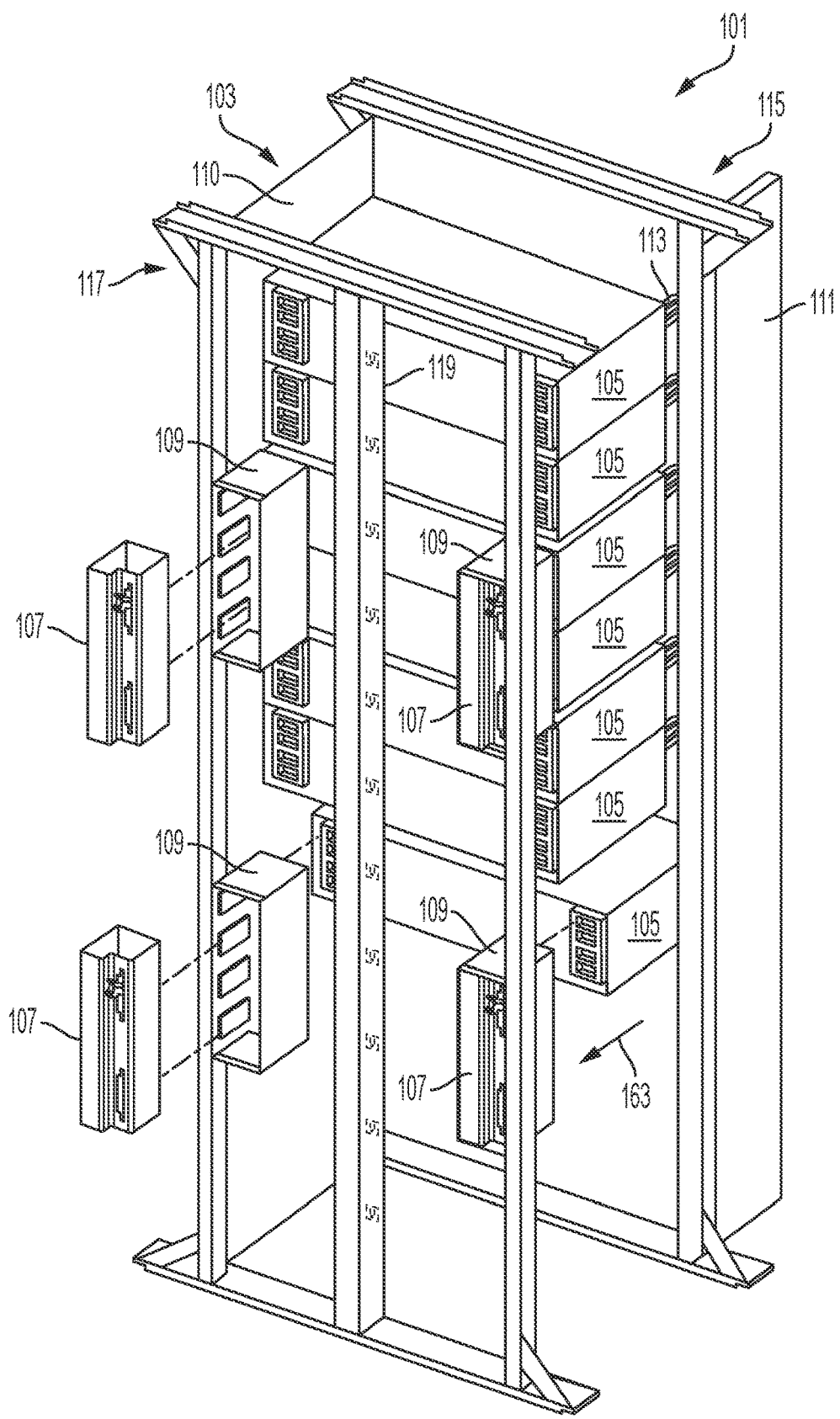
FIG. 1 depicts a rear perspective view of a system including cartridges for interconnecting appliances received within a rack according to various embodiments.

Embodiments herein are directed to connection structures and associated components for computing equipment, such as may be used in computer networks for data centers or other locations. The connection structures can include cartridges that can be installed relative to racks bearing appliances such as computer servers, networking hardware components, or other computing devices.

The cartridges can facilitate rapid installation and connection of the appliances to one another within the rack. For example, the rack can arrange the appliances above one another so that ports in the rear of the appliances are aligned vertically. The cartridges can include connectors present on rectangular projections that are spaced apart to match spacing between the ports. Thus, installing the cartridge (such as by translating the cartridge toward the rear of the rack) can cause the projections to simultaneously engage multiple vertically aligned ports.

An electronics board (such as a printed circuit board) within the cartridge can provide interconnection between different subsets of the ports to enable transmission of data signals back and forth, for example. The electronics board may include suitable tracings of metal or other conductive material to provide different combinations of routing among ports and associated components. As an illustrative example, an upper appliance may include a stack of four upper ports while a lower appliance includes a similar stack of four lower ports. Within the cartridge, the routing from a first projection may run down to a fifth projection so that the uppermost ports of each of the upper and lower appliance in the rack can transmit data to one another, while the respective second-topmost ports can be interconnected by routing through second and sixth projections of the cartridge, and so forth. Additionally or alternatively, the routing may enable transmission of one port relative to multiple others. In a particularized illustrative example, cartridges may be implemented to connect one appliance having eight graphics processing units to another appliance having another eight graphics processing units, which connection may enable operation as a system leveraging sixteen graphics processing units.

Aligning the electronics board vertically within the cartridges may allow connections to be made without cabling or with less cabling than other arrangements. For example, use of a cartridge with an electronics board to connect at a rear of a rack may provide connections that may avoid and/or reduce cabling connections within or between appliances, which may reduce or eliminate space consumption by cabling, avoid airflow blockage from cabling or associated components, and/or avoid bend constraints or limitations imposed by cabling.

In use, the cartridges can provide rapid and simple installation in a manner that can readily connect multiple sets of ports to one another at once. Installation of the cartridges may be facilitated by guides. The guides can engage mating structures on the cartridge to facilitate blind mating of the projections of the cartridge with ports of the appliances. For example, ramped surfaces, camming surfaces, cam-following features, pins and correspondingly sized openings, or other guide structures may be utilized. Guides and/or mating structure may be included in cages, for example, which may be mounted at suitable locations along the rear of the rack. The cages may be arranged at positions where ports are present or expected to be present upon installation of corresponding appliances. Inserting a cartridge into a cage may align and/or secure the cartridge for engagement with ports in appliances that are already installed or in appliances that are installed after the cartridge.

Once seated, the cartridge can be secured in place to secure the cartridge relative to the rack. For example, the cartridge may be secured by a latch. The latch may engage in response to inserting the cartridge. Additionally or alternatively, the latch may include a depressible lever or other actuator or manipulandum operable to secure and/or release the cartridge from a secured position. Once secured, the cartridge may remain in place relative to the rack even when appliances are pulled out of the rack for maintenance, replacement, or other access of the appliances (and thus out of engagement with the cartridge) or when further appliances are installed into open slots or berths within the rack (such as when filling empty slots with new or re-inserted appliances).

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 depicts an assembly or system 101. The system 101 can include a rack 103, appliances 105, and cartridges 107. Generally, the appliances 105 can be received or situated within the rack 103, and the cartridges 107 can be installed in coupling engagement with the appliances 105 to provide interconnection among the appliances 105, such as for transfer of data, power, or other signals. During installation, the cartridges 107 may be mounted to the rack 103. The mounting may be direct or via intervening structure, such as cages 109.

The rack 103 can include suitable structure for supporting appliances 105 and associated components. For example, metal or other suitably load-bearing material may be implemented in columns, beams, panels, or other suitable structures, which may include the cages 109. Structure of the rack 103 can be coupled by bolts, screws, or any other suitable fasteners or fastening technique (including, but not limited to, welding, adhesives, or mechanical fasteners). The appliances 105 may be slidably received within the rack 103, such as along rails or other tracks (which are omitted for the sake of clarity in FIG. 1). For example, the rails or other tracks may be mounted between uprights and/or on or along a side panel, one of which is visible at 110 by way of example at left in FIG. 1 and one of which is removed from view at right in FIG. 1 for ease of viewing other features within the rack 103.

In FIG. 1, the rack 103 is also shown with the cages 109 installed for facilitating engagement with the cartridges 107. The cages 109 may correspond to a portion of the rack 103 and/or may correspond to structure coupled with the rack 103. The cages 109 may be positioned at any suitable vertical position along the rack 103. For example, in FIG. 1, some cartridges 107 are shown received or releasably secured by cages 109 that are rearwardly mounted to an upper portion of the rack 103, while other cartridges 107 are shown received or releasably secured by cages that are rearwardly mounted to a lower portion of the rack 103. However, cages 109 may be additionally or alternatively situated to receive any part of the cartridges 107 and/or arranged at one or more intermediate or other positions to provide suitable securing or anchoring of the cartridges 107. Additionally, although the cartridges 107 are depicted as extending substantially along the full heights of two adjacent appliances 105, the system 101 may additionally or alternatively include cartridges 107 of greater or lesser height, such as cartridges 107 that extend along less than the full height of a given adjacent appliance 105, cartridges 107 that extend along a larger distance than a combined height of two adjacent appliances, and/or cartridges 107 that may correspond to (or exceed or be less than) some other whole or partial portion of the full height of the rack 103 or associated component.

The rack 103 may also support and/or be serviced by a power supply unit 111. The power supply unit 111 may supply power through power conduits 113, which may provide power to the appliances 105. The power supply unit 111 is shown along a front side 115 of the rack 103, and the cartridges 107 are shown installed along a rear side 117 of the rack in FIG. 1, although the respective front or rear placement of respective components may be reversed or otherwise different than that depicted in FIG. 1. A power rail 119 is also shown in FIG. 1 along the rear side 117 of the rack 103 and may correspond to an alternative or additional structure of the power supply unit 111. The power rail 119 may include outlets or other suitable interfaces for engaging prongs or other structures of the appliances 105 for transmission of power, for example.

The appliances 105 can include computer servers, network hard drive components, network switches, or other network hardware components or other appliance for a data center or other environment. In some embodiments, the appliances 105 may correspond to a single type of component (e.g., all network switches) or may include combinations of different types of components (e.g., some network switches and some servers). Examples of computing components that may be included within the appliances 105 a printed circuit board, a fan, a solid state drive (SSD), a hard disk drive (HDD), a graphics processing unit (GPU), a heat sink, a cable, a connector, an interface, and/or other elements that may contribute to the operability of the appliance 105. Although listed individually, any of such components may be present singly or in multiples (or absent).

In an installed position (such as shown along a right side of the rack 103 in FIG. 1), the cartridges 107 may provide interconnection among the appliances 105. In use, to reach an installed position, the cartridges 107 may be installed relative to additional structure discussed further in FIG. 2.

Figure 2:
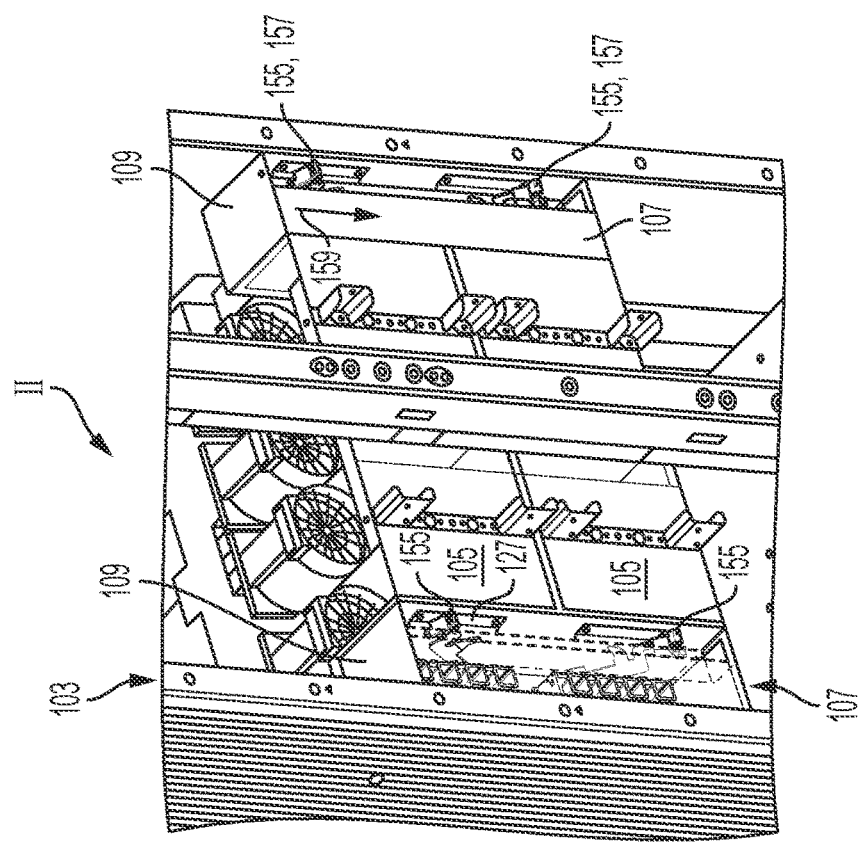
FIG. 2 depicts a partially exploded assembly view of a portion of the system of FIG. 1 according to various embodiments.
Figure 2:
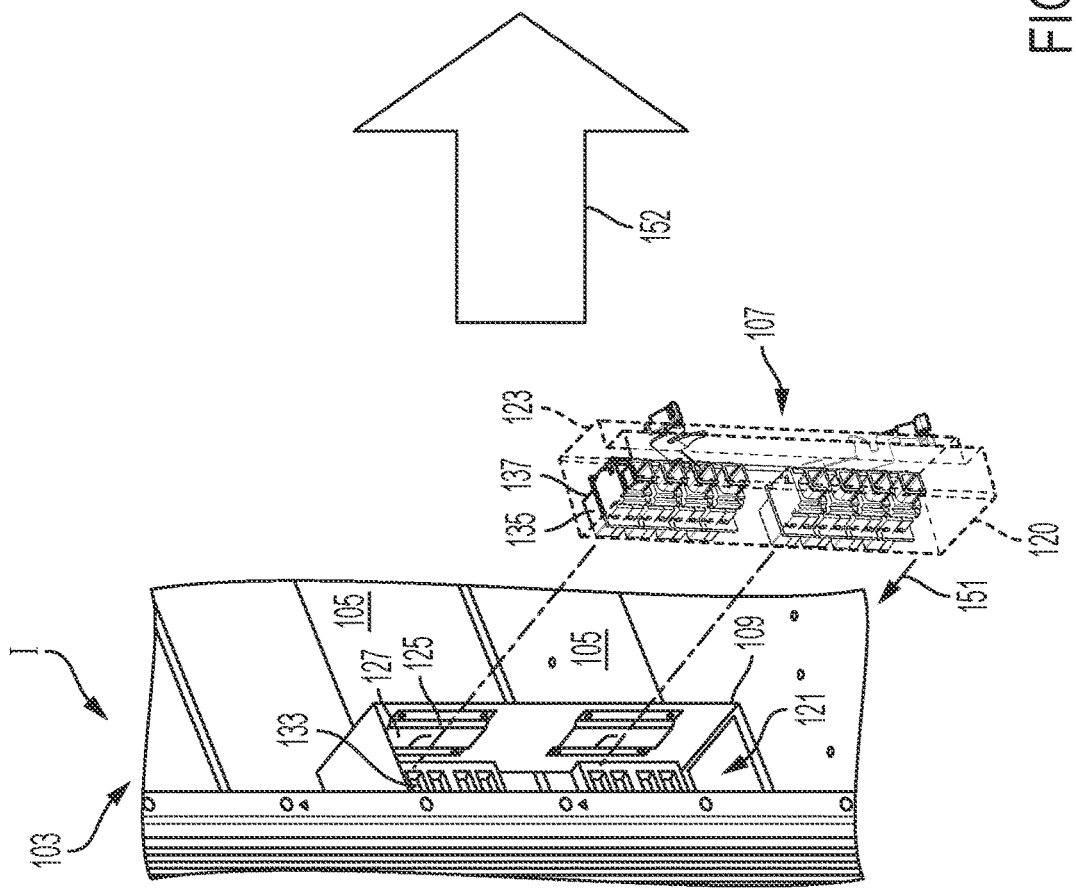

FIG. 2 (e.g., at a state I depicted at a leftward portion of the figure) illustrates a partially exploded assembly view of a portion of the system 101 of FIG. 1. A given cartridge 107 can include sub-features that can facilitate engagement with sub-features of the rack 103 and/or with sub-features of the appliances 105. For example, the cartridge 107 can include a body 120 sized for receipt in the cage 109. This may include a vertical cross-section of the body 120 of the cartridge 107 being sized to correspond to or fit within a vertical cross-section of an opening 121 defined by the cage 109. The cage 109 and the body 120 of the cartridge 107 may be sized such that engagement of the cartridge 107 with the cage 109 aligns the cartridge 107 relative to the rack 103 and/or appliances 105.

More generally, the cartridge 107 can include a guide 123 that can interface with a receiver 125 (e.g., which may be included in the cage 109 and/or the rack 103). The guide 123 in FIG. 2 is depicted as a sliding surface forming part of the body 120 of the cartridge 107, and the receiver 125 is depicted as including a corresponding ramped surface, although the guide 123 and/or receiver 125 can include pins, openings, recessed features, or any other suitable guiding structures additionally or alternatively. The receiver 125 is shown in FIG. 2 as further being defined at least in part by a bracket 127. The bracket 127 is shown in FIG. 2 as an element that is releasably attachable (e.g., by fasteners), although permanently fixed attachment additionally or alternatively may be used. The bracket 127 may be included at least in part for directing alignment and/or for facilitating latching as discussed further below.

Overall, the cage 109 can provide a suitable constraint to define a suitable slot or berth for the cartridge 107. For example, the cage 109 may facilitate installation of a cartridge 107 to engage a column or set of vertically aligned ports 133 of the appliances 105. However, although description herein primarily references vertically aligned ports 133, components and techniques may additionally or alternatively be implemented in other orientations, such as in which ports 133 are horizontally aligned, linearly aligned, aligned in a staggered orientation, or otherwise aligned along a first or other direction. Moreover, although the cage 109 is shown as having a rectangular form factor with four sides, the cage 109 can include any shape, number of sides, and/or form factor, which may include open-sided, c-shaped, or any other continuous or discontinuous perimeter around a volume for receiving the cartridge 107. Overall, the guide 123 and the receiver 125 (and/or other features of the cartridge 107, the cage 109, the rack 103, and/or the appliance 105) can function to facilitate proper alignment of the cartridge 107 during installation.

The appliances 105 can include respective ports 133. The ports 133 can include any suitable form factor and may differ from or be alike to one another. The ports 133 may correspond to—or be compatible with—backplane structures, for example. The ports 133 may correspond to any suitable form factor of pluggable module, pluggable media, pluggable transceiver, or other pluggable component. For example, the ports 133 may be sized and arranged to meet any suitable standard for pluggable optical transceivers. In one non-limiting example, one or more of the ports 133 may correspond to a small form-factor pluggable (SFP) transceiver, such as is commonly used for telecommunication and/or data communications applications. In another non-limiting example, one or more of the ports 133 comprises an enhanced small form-factor pluggable (SFP+) transceiver or a compact small form-factor pluggable (CSFP) transceiver. In an additional non-limiting example, one or more of the ports 133 comprises an RJ45 connector or a similar connector. Further non-limiting examples may include QSFP, QSFP+, QSFP28, QSFP56, QSFP56-DD, OSFP, or other standards that may be known in the art.

The ports 133 can be arranged so that the ports 133 are vertically aligned, aligned in columns or rows, or otherwise aligned between different appliances 105. Although the example in FIG. 2 depicts a set of eight vertically aligned ports 133 in which four ports 133 are arranged in an upper appliance and four other ports 133 are arranged in a lower appliance, aligned ports 133 may be distributed across appliances 105 in any suitable manner. Any appliance 105 may include any suitable number of one or more of the aligned ports 133, and appliances 105 may differ or be alike in number of the aligned ports 133 included. The ports 133 can provide interfaces for connection and transfer of data or other electrical or optical signals or other varieties of signals. Any suitable arrangement and/or features may be utilized to facilitate appropriate engagement of the ports 133 with structure of the cartridge 107. For example, the cage 109 as depicted in FIG. 2—or any other suitable guiding, aligning, protecting, and/or other interfacing structure—may be utilized.

The cartridge 107 can include connectors 135. The connectors 135 can include suitable structure for engaging the ports 133. For example, the connectors 135 and the ports 133 can correspond to opposite mating components of a connection interface that are sized and arranged for engaging one another. The connection interface can facilitate blind-mate engagement, for example. Any suitable male and female portions of the connection interface may be included among the connectors 135 and ports 133. For example, although FIG. 2 primarily depicts connectors 135 having projections or pins insertable into holes or pin-holes in the ports 133, either or both of the port 133 and connector 135 may include some protruding structure that is receivable within an opening, may include an opening or other suitable complementary structure suitable for receiving a protrusion from a mating component, or may include some combination of protrusion and receiving structure. As a further illustrative example, although the arrangement depicted in FIG. 2 is shown with ports 133 that appear substantially flush with a rear face defined by the appliances 105, ports 133 may additionally or alternatively include structure that is recessed into and/or projecting out from the appliances 105. Similarly, although the connectors 135 are shown projecting from the cartridge 107, connectors 135 may additionally or alternatively include structure that is flush and/or recessed relative to the cartridge 107.

In FIG. 2, the connectors 135 are depicted as borne by and/or included in projections 137. The projection 137 may extend forward of the body 120 of the cartridge 107. For example, the body 120 may include a casing or shell formed of metal, plastic, or some other suitable material for the body 120 to be rigid, elongate, and/or upright during use. For ease of viewing, the body 120 at state I in FIG. 2 is shown as transparent as represented by phantom lines to more easily view other parts of the cartridge 107, although in use, the body 120 may be transparent, translucent, opaque, or feature any other visual appearance. The body 120 may be hollow or tube-like, e.g., which may facilitate a construction such as that shown in FIG. 3A.

Figure 3A:
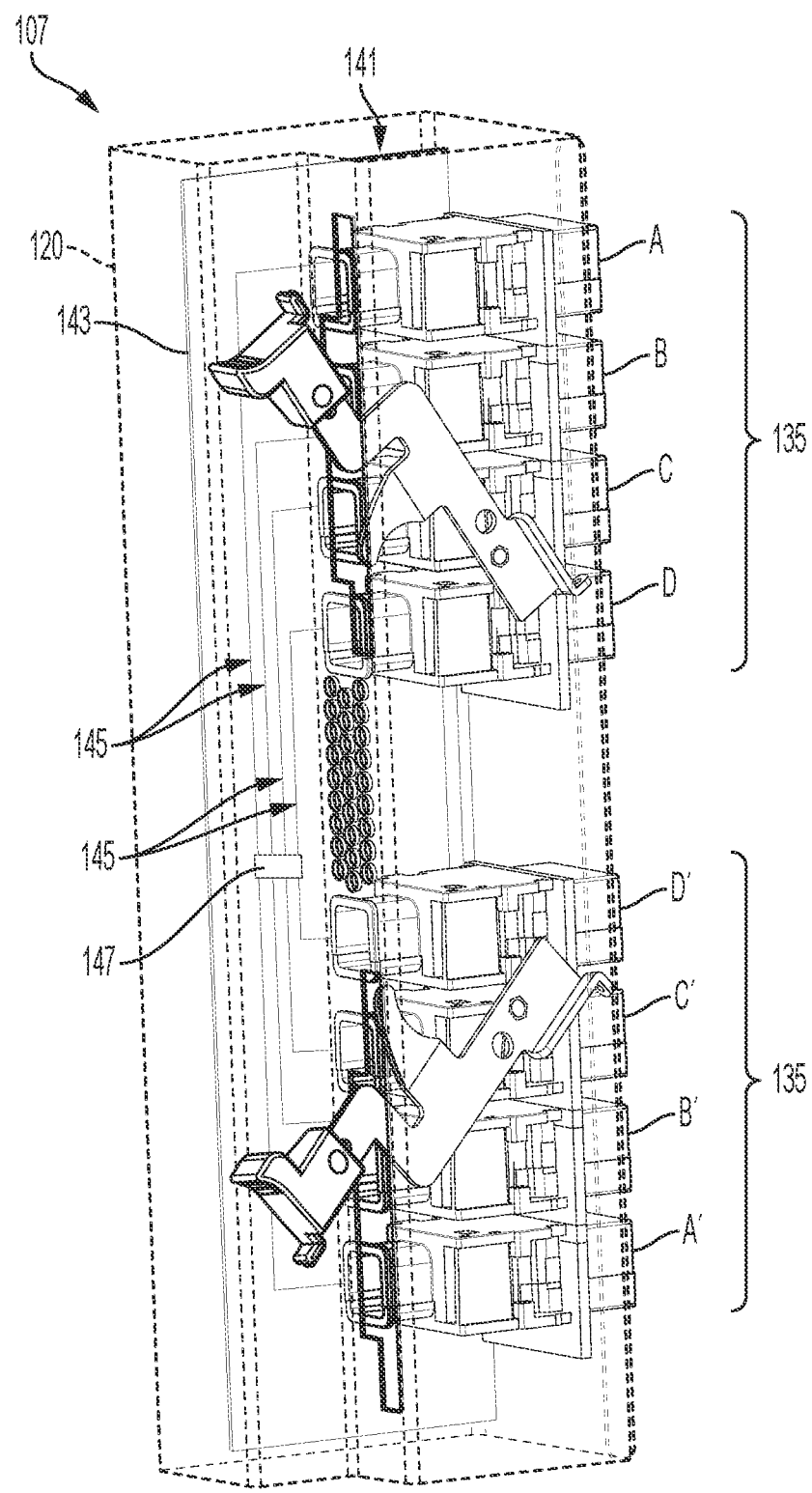
FIG. 3A depicts a side perspective view of a cartridge of the system of FIG. 1 according to various embodiments.

FIG. 3A illustrates a side perspective view of a cartridge 107. Once again, for ease of viewing, the body 120 in FIG. 3A is represented by phantom lines. The body 120 of the cartridge 107 may define an internal volume 141. The internal volume 141 may contain an electronics board 143. The electronics board 143 may be or include a printed circuit board, for example. As non-limiting examples, the electronics board 143 may include silicon, metal, glass, or other materials suitable for transmission of appropriate signals therethrough. The electronics board 143 may be configured for use with any suitable type of cable or other conduit including, but not limited to, electrical cable (e.g., formed with copper or other electrically conductive cores), fiber optic cables (e.g., formed with a glass or other light-transmitting core), or other types. Generally, the electronics board 143 can include suitable traces, optical paths, and/or other conduits for transmitting electrical power, data, and/or other signals therethrough. Although the electronics board 143 and associated components depicted and described herein may be particularly suited for optical transmissions, in some aspects, the electronics board 143 may be replaced with and/or include a conduit for other connection types, in addition or as alternatives, such as connections for acoustic communication, fluid communication, and/or electrical communication.

Figures 3B, 3C:
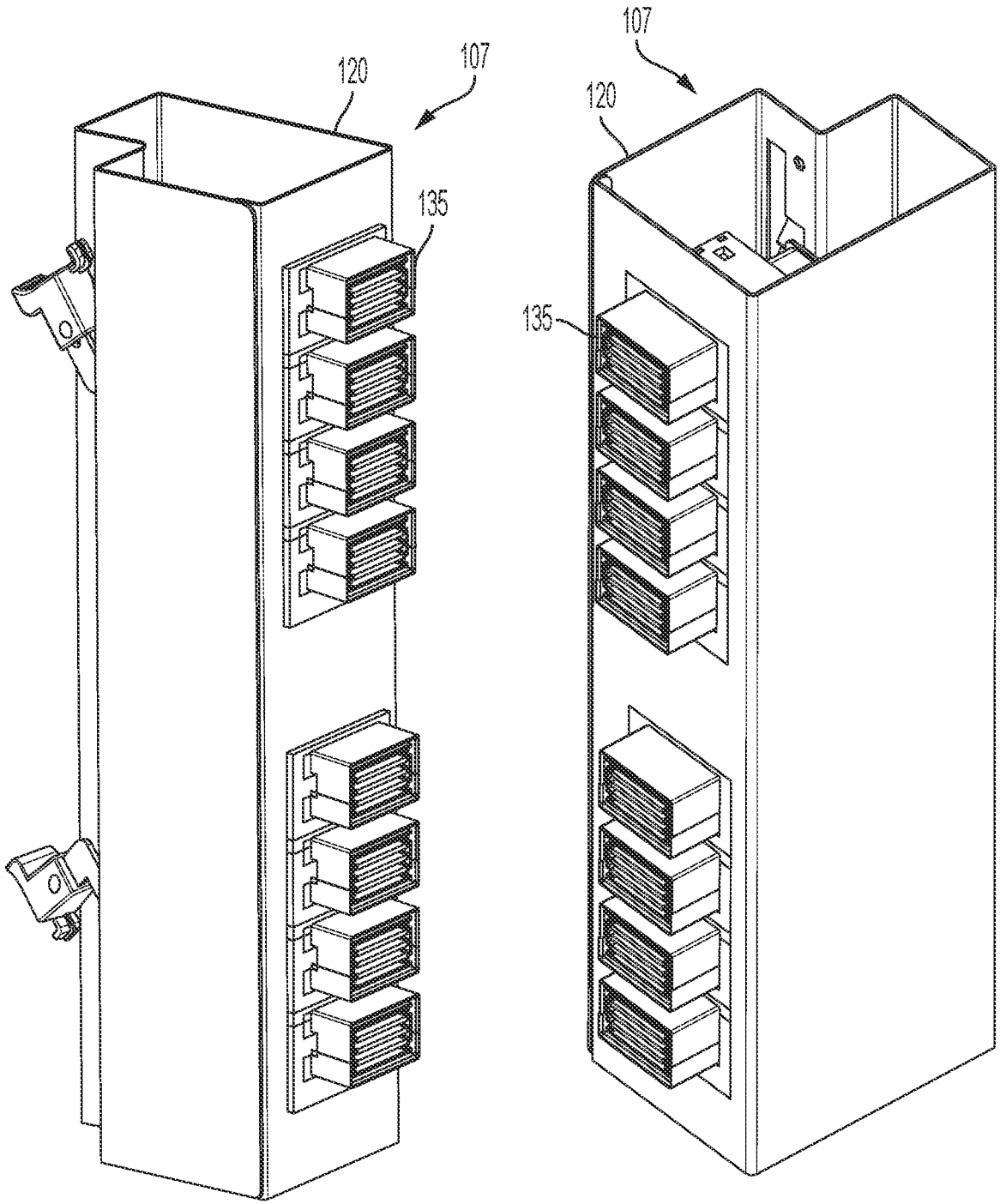
FIGS. 3B and 3C depict front perspective views of a cartridge of the system of FIG. 1 according to various embodiments.

The electronics board 143 may support structure of the connectors 135. For example, the connectors 135 may be mounted on the electronics board 143 in use. Use of the electronics board 143 may provide a compact form factor for transferring signals between connectors 135. Examples of structure of the connectors 135 that may be visible extending from the body 120 of the cartridge 107 are depicted in FIGS. 3B and 3C, for example.

Referring again to FIG. 3A, the electronics board 143 can include individual conduits 145. Each respective conduit 145 may be coupled at one end to a respective connector 135 and routed through the body of the cartridge 107. Multiple conduits 145 may be connected with a particular connector 135 and appropriately arranged to facilitate connection with different lanes or channels enabled by the connector 135. Any suitable combination or routing of conduits 145 may be utilized to provide interconnection among subsets of the connectors 135.

The conduits 145 may establish signal paths between respective pairs of the connectors 135 and/or associated ports 133, for example. In FIG. 3A, respective connectors 135 are identified with individual letters which indicate which connectors 135 are connected to one another by conduits 145. For example, the conduits 145 may function so that the connectors 135 labeled A and A' are connected to one another, while the connectors 135 labeled B and B' are connected to one another, and so on. FIG. 3A is but one example of how the internal conduits 145 may be arranged to provide connection to subsets among the connectors 135 depicted in FIG. 3A, however. For example, if a different set of interconnectivity is desired for a particular scenario, a cartridge 107 with a different arrangement of conduits 145 may be provided in which other subsets are connected differently (such as with A being connected to D', B being connected to C', and so on as an illustrative example). Such variability may allow ready interchangeability among cartridges 107 with different conduit arrangements to rapidly change arrangements of interconnection or signal paths among the appliances 105.

The cartridge 107 is not limited to the number of connectors 135 shown in FIG. 3A, but may include fewer or more and/or different spacing or clustering as fits a particular scenario. Generally, any number of two or more connectors 135 can be included on a cartridge 107 to provide a suitable connection between a corresponding arrangement of ports 133 of appliances 105. In addition, the connectors 135 may be clustered into subgroups (e.g., A through B and B' through A' may be in one interconnected group while C through D and C' through D' may be in another, distinct interconnected group in one illustrative example). At the same time, it is to be understood that the routing of the conduits 145 within the cartridge 107 may permit connection between different subgroups of connectors 135. In addition, although FIG. 3A illustrates an arrangement of conduits 145 with a one-to-one arrangement between coupled connectors 135, the conduits 145 may additionally or alternatively include arrangements of conduits 145 in which many-to-one, one-to-many, or many-to-many arrangements are enabled by the conduits 145.

In some examples, the electronics board 143 may be capable of shifting among different configurations of routing. For example, the electronics board 143 may include a suitable switch 147 or other component capable of changing routing. As an illustrative example, the switch 147 or other component may route a signal from a conduit 145 from the connector 135 labeled A and selectively route the signal along one or more of the conduits 145 toward a selected one or more of the connectors 135 labeled A', B', C', and/or D'. In some examples, redundant tracing (e.g., multiple traces to and/or from an individual connector 135) may be included to facilitate alternative paths for use by the switch 147 or other component in selecting among differing routing options. The switch 147 may include suitable hardware and/or software (e.g., instructions accessible from a memory device to cause a processor to perform associated functions) to enable such operations. In some embodiments, differing varieties of the cartridge 107 (e.g., some having capabilities from a switch 147 or other component, and others without such capabilities) may be made available and/or provided as options, for example, to accommodate differing operational preferences of clients.

Referring again to FIG. 2, FIG. 2 illustrates a side view of the system 101 in differing states of installation and utilization according to certain embodiments. At state I in FIG. 2, elements are depicted in a position that can facilitate installation. The cartridge 107 may be positioned so that the guide 123 is aligned with the receiver 125 (e.g., in the cage 109 or other portion of the rack 103). The cartridge 107 may be translated or otherwise moved toward the rack 103, e.g., as illustrated by arrow 151. As the guide 123 approaches and is received by and/or engages the receiver 125, the ramped surface and/or other mating features of the receiver 125 may cause adjustments in the alignment of the cartridge 107 relative to the rack 103 so that the connectors 135 of the cartridge 107 are aligned with the ports 133 of the appliances 105. Generally, movement toward the rack 103 may cause the cartridge 107 to shift positions (e.g., as depicted by arrow 152). For example, the cartridge 107 may shift from an uninstalled but ready and/or aligned position (e.g., such as that shown at state I in FIG. 2) and arrive into a seated position (e.g., such as that shown at state II in FIG. 2).

FIG. 2 at state II depicts a pair of cartridges 107 each in a seated position (e.g., with the cartridge 107 at left again shown with a transparent appearance while the cartridge 107 at right is instead shown with an opaque appearance for comparison). In the seated position, the cartridge 107 may be secured, for example, by a latch 155 which may engage the cage 109 (e.g., engaging the bracket 127) or other portion of the rack 103. The latch 155 can include any pawl or other suitable structure that may be movable to engage in a locking manner to secure the cartridge 107 relative to the rack 103. The latch 155 may be operated by a lever 157, such as by depressing the lever 157 as illustrated by arrow 159. Depending on the configuration, depressing the lever 157 may cause the latch 155 to secure or release relative to the cage 109 or other portion of the rack 103. Although a lever 157 is shown in FIG. 2, the latch 155 may be actuated into or out of a locking position by operation of any suitable button or other manipulandum.

The cartridge 107 may be secured to the cage 109 or other portion of the rack 103 independently of engagement of the connectors 135 of the cartridge 107 with the ports 133 of the appliances 105. For example, the cartridge 107 may be installed and secured in a rack 103 regardless of whether appliances 105 are present in the rack 103. The cartridge 107 being secured by the latch 155 may facilitate other operations relative to the system 101.

For example, the latch 155 can prevent the cartridge 107 from release from the cage 109 or other portion of the rack 103. Such securing may be useful, e.g., with respect to movement of appliances 105 such as depicted by arrow 163 in FIG. 1. For example, the cartridge 107 being secured by the latch 155 may allow appliances 105 to be moved within the rack 103 without impacting the positioning of the cartridge 107 relative to other appliances 105. Additionally or alternatively, the cartridge 107 being secured by the latch 155 may facilitate installation of appliances 105 relative to the rack 103. For example, the sliding motion depicted by arrow 163 (in which the appliance 105 may be pushed against the cartridge 107 to cause engagement between the connector 135 and the port 133) may occur without the cartridge 107 becoming dislodged from pushing by the appliance 105. Securing may facilitate the cartridge 107 maintaining connection among seated appliances 105 even while other appliances 105 are switched to an unseated position and/or installed in open slots within the rack 103. This may prevent disruption of service in the rack 103 in the midst of maintenance in a manner that may be more beneficial than if the cartridge 107 were susceptible to dislodging any time a new appliance 105 were installed or if the cartridge 107 had to be removed to permit access to the appliances 105.

The cartridge 107 may be removed by operations that correspond to progressing in reverse through FIG. 2. For example, the latch 155 may be released, such as by toggling the lever 157 opposite the direction indicated by arrow 159 in FIG. 2. Releasing the latch 155 may unlock the cartridge 107 to facilitate removal (e.g., by translation away from the rack 103 in a direction opposite that illustrated by arrow 151 in FIG. 2). The cartridge 107 may be removed, for example, to facilitate maintenance or replacement (e.g., with a cartridge 107 having the same or a different arrangement of conduits 145, depending on the arrangement of interconnection among appliances 105 that is desired for a given scenario).

Figure 4:
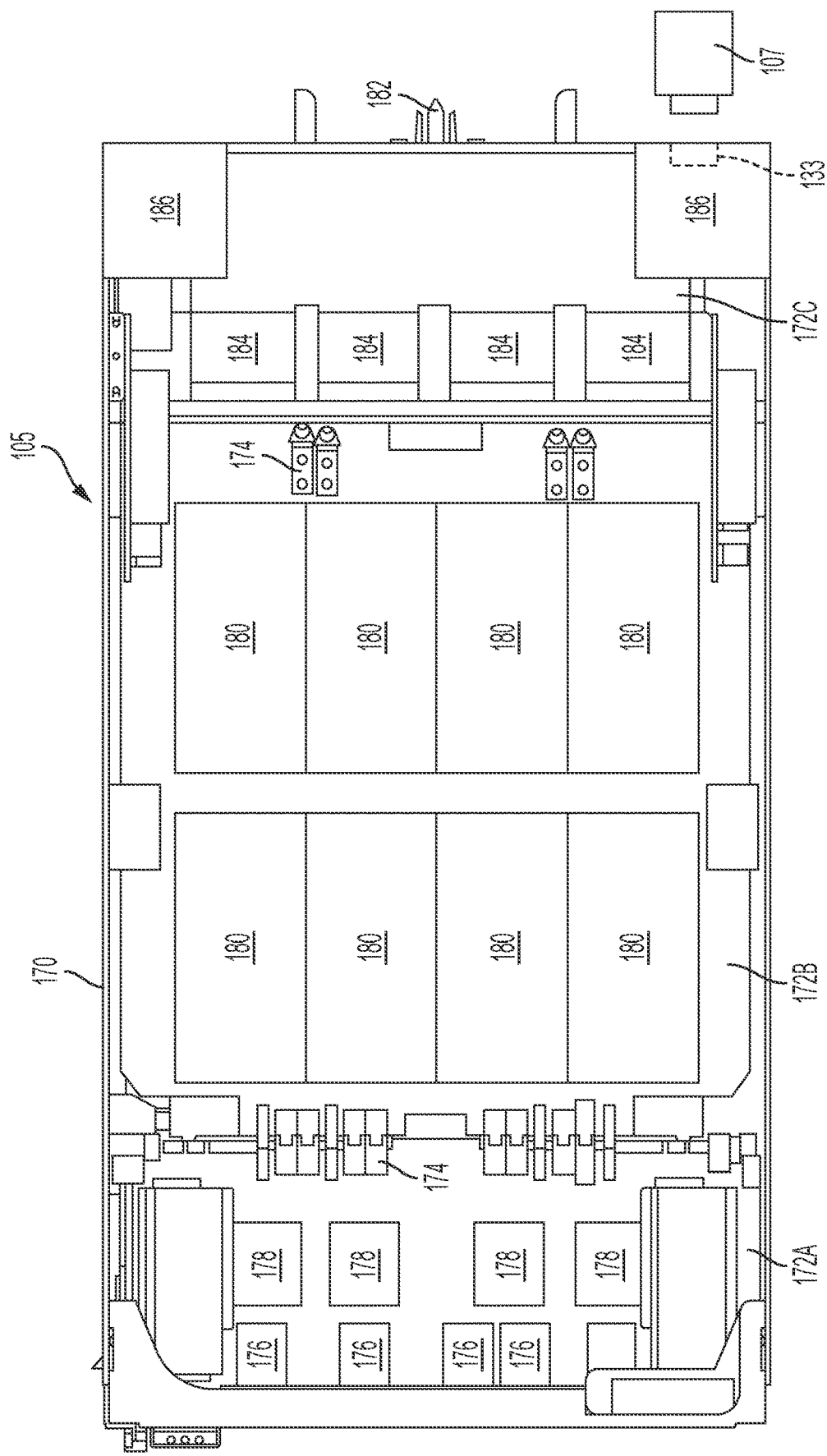
FIG. 4 depicts a top view of an example of an appliance that may be used with the system of FIG. 1 according to various embodiments.

FIG. 4 illustrates a top view of an appliance 105 that may be utilized in the system of FIG. 1 in accordance with various embodiments. The appliance 105 depicted in FIG. 4 is an example that may be particularly suited for use in the system 101, although other forms of the appliance 105 may be utilized.

The appliance 105 depicted in FIG. 4 includes a chassis 170 in which and/or relative to which other components are arranged. The chassis 170 can include elements of a server box, for example. The chassis 170 can be formed of sheet metal, although plastics or other non-metal materials may be used in addition or substitution.

In FIG. 4, the appliance 105 is depicted with a first board 172A, a second board 172B, and a third board 172C, although any number of one or more boards 172 may be utilized. Each board 172 may correspond to a printed circuit board or other electronics board (e.g., which may be capable of interconnecting other components borne thereby or in connection therewith). The boards 172 may be communicatively coupled with board-to-board connectors 174, cabling, or other connection structures.

The first board 172A may correspond to a switch board. For example, the first board 172A may include port connectors 176 and switch processors 178. The port connectors 176 may provide suitable connections to cabling or other conduits (e.g., such as through form factors noted above for ports 133), and the switch processors 178 may perform suitable operations or transformations to enable communication of data between the port connectors 176 and other components within the appliance 105.

The second board 172B may correspond to a processing board. For example, the second board 172B may include graphics cards 180. The graphics cards 180 in some cases may be replaced by disk drives or other cards or processing units. (or other components).

The third board 172C may correspond to a power distribution board. For example, the third board 172C may include a power connector 182 (e.g., which may correspond to prongs to engage a power rail 119).

The appliance 105 may include other features to facilitate operation. For example, fans 184 may be included to facilitate airflow through the appliance 105 for suitable cooling for other components. Although the fans 184 are depicted toward a rear of the appliance 105, other locations are also possible.

The appliance 105 can further include mechanical connection structures 186. For example, the mechanical connection structures 186 may include the ports 133 and suitable structure for providing communication between the ports 133 and other components of the appliance 105. In some examples, each mechanical connection structure 186 includes a stack of four ports 133, although other numbers of fewer or more can be utilized. Although the appliance 105 in FIG. 4 is shown with a pair of mechanical connection structures 186, any number of one or more can be utilized.

The mechanical connection structure 186 can facilitate engagement with a cartridge 107 as described elsewhere herein. In some examples, utilization of a cartridge 107 can allow multiple instances of the appliance 105 to operate as a collective unit. For example, the cartridge 107 may allow two sets of eight graphic cards 180 to operate as a single set of sixteen graphic card 180 (or allow a similar interconnected set of sixteen or other relevant number of graphic cards, disk drives, or other cards, processing units, or components). In some examples, adjacent appliances 105 can be connected by the cartridge 107 without utilizing a headnode that can occupy additional space and incur additional cost to provide and/or maintain. In some examples, use of the cartridge 107 can also eliminate, obviate, or reduce internal cabling for interconnecting components within the appliance 105, e.g., which may reduce difficulty of servicing cables and/or avoid airflow blockage or other space consumption by cables. In some cases, avoiding airflow blockage from cables can also sufficiently improve airflow through the appliance so as to permit fewer fans 184 to be utilized than if cables were instead utilized.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors 5 intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system comprising:
   a plurality of appliances each comprising a computer server or a network hardware component;
   a rack in which the appliances are slidingly received and arranged vertically such that rear ports of the appliances are vertically aligned;
   a cage mounted to the rack along a rearward face of the rack; and
   a cartridge comprising:
      a body received in and releasably secured to the cage;
      a plurality of forward-extending projections bearing connectors engaged with the vertically aligned rear ports of the appliances;
      an internal printed circuit board connecting differing combinations of the forward-extending projections so as to establish signal paths between respective pairs of the vertically aligned rear ports of the appliances; and
      a latch operable for securing the cartridge to the cage independently of engagement of the connectors of the cartridge with the vertically aligned rear ports of the appliances.

2. The system of claim 1, wherein the cartridge and the cage are sized and arranged such that engagement of the cartridge with the cage aligns the cartridge for engagement of the connectors of the cartridge with the vertically aligned rear ports of the appliances.

3. The system of claim 1, wherein the plurality of appliances comprises a first appliance containing a first graphics card communicatively connected through the cartridge to a second graphics card in a second appliance of the plurality.

4. A system, comprising:
   a rack;
   a plurality of appliances vertically arranged in the rack such that vertically aligned ports of the appliances are present; and
   a cartridge comprising an upright rigid body along which connectors are arranged, the connectors engageable with the vertically aligned ports of the appliances in response to translation of the cartridge toward the rack, wherein the cartridge further comprises an electronics board within the upright rigid body, the electronics board providing signal paths among the connectors, wherein the rack further comprises a cage for receiving a portion of the cartridge.

5. The system of claim 4, wherein the cage is sized and arranged to guide the cartridge so as to align the connectors with the vertically aligned ports.

6. The system of claim 4, wherein the cartridge is securable to the rack by a latch.

7. The system of claim 6, wherein the latch secures the cartridge to the rack in a position in which the cartridge maintains connection among seated appliances in the rack as other appliances are slidingly removed from engagement with the cartridge.

8. The system of claim 6, wherein the latch secures the cartridge to the rack in a position in which the cartridge maintains connection among seated appliances in the rack as other appliances are slidingly moved into engagement with the cartridge.

9. The system of claim 4, wherein the cartridge includes an upper portion engageable with at least two vertically aligned ports of an upper appliance, and wherein the cartridge further includes a lower portion engageable with at least two other vertically aligned ports of a lower appliance.

10. The system of claim 4, wherein the cartridge is installed at a rear of the rack.

11. The system of claim 4, wherein the plurality of appliances each comprises a computer server or a network hardware component;
   wherein the appliances are slidingly received and arranged vertically above or below one another in the rack;
   wherein the system further comprises a cage mounted to the rack along a rearward face of the rack;
   wherein the cartridge further comprises a plurality of forward-extending projections bearing the connectors;
   wherein the connectors are engaged with the vertically aligned ports of the appliances;
   wherein the electronics board comprises an internal printed circuit board connecting differing combinations of the forward-extending projections so as to establish signal paths between respective pairs of the vertically aligned ports of the appliances;
   wherein the connectors are sized for engagement with the vertically aligned ports of the appliances; and
   wherein the electronics board is arranged to couple subsets of the connectors to one another.

12. A system comprising a cartridge for installation relative to a rack or relative to a plurality of appliances arranged in the rack such that ports of the appliances are linearly aligned along a first direction, the cartridge comprising:
   an elongate rigid body including a shell defining an internal volume;
   an electronics board fully housed within the internal volume of the shell of the elongate rigid body; and
   connectors arranged along the elongate rigid body and sized for engagement with the aligned ports of the appliances,
   wherein subsets of the connectors are coupled to one another by the electronics board within the elongate rigid body.

13. The system of claim 12, wherein the cartridge comprises a guide engageable with the rack so as to align the connectors with the linearly aligned ports.

14. The system of claim 12, wherein the cartridge comprises a manipulandum actuatable to engage or disengage a latch operable to secure the cartridge to the rack.

15. The system of claim 12, wherein the connectors comprise blind-mate connectors.

16. The system of claim 12, further comprising the rack and the plurality of appliances linearly arranged in the rack.

17. The system of claim 16, wherein the connectors are engageable with the linearly aligned ports of the appliances in response to translation of the cartridge toward the rack; and
   wherein the electronics board provides paths among subsets of the connectors.

18. The system of claim 17, wherein the plurality of appliances each comprises a computer server or a network hardware component;
   wherein the appliances are slidingly received and arranged vertically in the rack such that the ports of the appliances are vertically aligned;

wherein the system further comprises a cage mounted to the rack along a rearward face of the rack;
wherein the cartridge further comprises a plurality of forward-extending projections bearing the connectors;
wherein the connectors are engaged with the vertically aligned ports of the appliances; and
wherein the electronics board comprises an internal printed circuit board connecting differing combinations of the forward-extending projections so as to establish signal paths between respective pairs of the vertically aligned ports of the appliances.

\* \* \* \* \*